United States Patent
Okazaki

(10) Patent No.: US 8,486,789 B2
(45) Date of Patent: Jul. 16, 2013

(54) METHOD FOR MANUFACTURING INSULATED GATE FIELD EFFECT TRANSISTOR

(75) Inventor: Fumiaki Okazaki, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 12/031,013

(22) Filed: Feb. 14, 2008

(65) Prior Publication Data

US 2008/0197426 A1 Aug. 21, 2008

(30) Foreign Application Priority Data

Feb. 15, 2007 (JP) ................. 2007-035007

(51) Int. Cl.
*H01L 21/336* (2006.01)
*H01L 29/78* (2006.01)

(52) U.S. Cl.
USPC ............................ 438/287; 438/585; 257/411

(58) Field of Classification Search
CPC ......... H01L 21/31; H01L 21/336; H01L 21/82; H01L 29/78; H01L 21/768; H01L 23/522; H01L 23/532; H01L 27/02
USPC ........... 438/287; 257/411, E21.409, E29.255
See application file for complete search history.

(56) References Cited

U.S. PATENT DOCUMENTS

| 6,171,910 B1* | 1/2001 | Hobbs et al. | 438/275 |
| 2003/0157757 A1* | 8/2003 | Kumauchi et al. | 438/197 |
| 2006/0022277 A1* | 2/2006 | Kavalieros et al. | 257/369 |
| 2006/0214241 A1* | 9/2006 | Pidin | 257/407 |

FOREIGN PATENT DOCUMENTS

| JP | 2001-068563 | 3/2001 |
| JP | 2005-303256 | 10/2005 |
| JP | 2006-040986 | * 2/2006 |
| JP | 2006-269768 | 10/2006 |
| WO | WO2006020158 | 2/2006 |

OTHER PUBLICATIONS

Title: High-density plasma chemical vapor deposition of silicon-based dielectric films for integrated circuits Source IBM Journal of Research and Development archive vol. 43, Issue 1-2 (Jan. 1999). pp. 109-126 Author: S. V. Nguyen.*
Atsushi Yagishita et al.; High Performance Metal Gate MOSFETs Fabricated by CMP for 0.1um Regime; International Electron Devices Meeting 1998; Technical Digest pp. 785-788; 1998.
Japanese Patent Office Action corresponding to Japanese Serial No. 2007-035007 dated Jun. 30, 2009.

* cited by examiner

*Primary Examiner* — Walter H Swanson
(74) *Attorney, Agent, or Firm* — Dentons US LLP

(57) ABSTRACT

Disclosed herein is a method for manufacturing an insulated gate field effect transistor, the method including the steps of: (a) preparing a base that includes source/drain regions, a channel forming region, a gate insulating film formed on the channel forming region, an insulating layer covering the source/drain regions, and a gate electrode formation opening provided in a partial portion of the insulating layer above the channel forming region; (b) forming a gate electrode by burying a conductive material layer in the gate electrode formation opening; (c) removing the insulating layer; and (d) depositing a first interlayer insulating layer and a second interlayer insulating layer sequentially across an entire surface, wherein in the step (d), the first interlayer insulating layer is deposited in a deposition atmosphere containing no oxygen atom.

12 Claims, 13 Drawing Sheets

[PROCESS-140]

[PROCESS-100]

[PROCESS-100]

[PROCESS-100]

[PROCESS-100]

[PROCESS-110]

[PROCESS-110]

[PROCESS-120]

[PROCESS-130]

[PROCESS-140]

[PROCESS-200]

[PROCESS-200]

[PROCESS-200]

[PROCESS-200]

[PROCESS-210]

[PROCESS-210]

[PROCESS-220]

[PROCESS-230]

[PROCESS-240]

[PROCESS-310]

[PROCESS-320]

[PROCESS-410]

[PROCESS-420]

[PROCESS-30]

[PROCESS-40]

METHOD FOR MANUFACTURING INSULATED GATE FIELD EFFECT TRANSISTOR

CROSS REFERENCES TO RELATED APPLICATIONS

The present invention contains subject matter related to Japanese Patent Application JP 2007-035007 filed in the Japan Patent Office on Feb. 15, 2007, the entire contents of which being incorporated herein by reference.

BACKGROUND OF THE INVENTION

1. Field of the Invention

The present invention relates to a method for manufacturing an insulated gate field effect transistor.

2. Description of the Related Art

Currently, miniaturization of transistors is being advanced based on the so-called scaling rule, and thereby enhancement in the integration degree and the operating speed of semiconductor devices is being promoted. For miniaturization of an insulated gate field effect transistor (metal insulator semiconductor FET (MISFET)), it is demanded to suppress the influence of the so-called short-channel effect. As long as a gate electrode is composed of a semiconductor material, it is difficult to effectively suppress the depletion of the gate electrode, which is one of factors in the short-channel effect. To address this problem, there has been proposed a scheme in which a gate electrode is formed by using a conductive material such as a metal or metal compound. As a method for forming a gate electrode by using a conductive material, there has been proposed a method in which e.g. a metal film is deposited instead of a polycrystalline silicon film and this metal film is patterned to thereby form a gate electrode similarly to related-art methods. Furthermore, there has also been proposed a method in which a gate electrode is formed by a so-called damascene process of burying a conductive material in a gate electrode formation opening (refer to e.g., Atsushi Yagishita et al., "High Performance Metal Gate MOSFETs Fabricated by CMP for 0.1 μm Regime," International Electron Devices Meeting 1998 Technical Digest p.p. 785-788 (1998) and Japanese Patent Laid-Open No. 2005-303256). In the method of forming a gate electrode by a damascene process, a gate insulating film composed of e.g. an insulating material (e.g., hafnium oxide) having a relative dielectric constant higher than that of silicon oxide is formed in a gate electrode formation opening arising from removal of a dummy gate electrode, and then a gate electrode is formed. This method can enhance characteristics of the insulated gate field effect transistor.

The outline of a method for forming a gate electrode by a related-art damascene process will be described below with reference to FIGS. 1C, 1D, 1E, 1F, 5A, and 5B, which are schematic partial end views of a silicon semiconductor substrate and so on.

[Step-10]

Initially, a base 10 is prepared that includes source/drain regions 13, a channel forming region 12, a gate insulating film 30 that is formed on the channel forming region 12 and composed of hafnium oxide, an insulating layer 21 that is composed of $SiO_2$ and covers the source/drain regions 13, and a gate electrode formation opening 22 that is provided in a partial portion of the insulating layer 21 above the channel forming region 12 (see FIGS. 1C and 1D).

A method for manufacturing the base 10 will be described in detail later in the explanation of a first embodiment of the present invention. In the drawings, reference numeral 11 denotes a silicon semiconductor substrate. Reference numeral 13A denotes a silicide layer formed in upper part of the source/drain regions 13. Reference numeral 17 denotes a side wall film.

[Step-20]

After the preparation of the base 10, a work function control layer 31 composed of a metal material (hafnium silicide) for defining the work function of the gate electrode and a barrier layer (not shown) composed of TiN are sequentially formed across the entire surface (see FIG. 1E). Thereafter, a conductive material layer 32 composed of tungsten is formed across the entire surface based on so-called blanket tungsten CVD. Subsequently, planarization treatment based on CMP is carried out to remove the conductive material layer 32, the barrier layer, the work function control layer 31, and the gate insulating film 30 over the insulating layer 21 and the side wall film 17. In this manner, a gate electrode 23 can be obtained (see FIG. 1F). The gate electrode 23 is formed above the channel forming region 12 with the intermediary of the gate insulating film 30 therebetween and is formed of the work function control layer 31, the barrier layer (not shown), and the conductive material layer 32.

[Step-30]

Subsequently, an interlayer insulating layer 142 composed of $SiO_2$ is formed by e.g. high-density plasma CVD across the entire surface (see FIG. 5A).

[Step-40]

Subsequently, based on photolithography and dry etching, contact plug formation openings 43A and 43B are formed in partial portions of the interlayer insulating layer 142 above the gate electrode 23 and above the source/drain regions 13. Thereafter, a second barrier layer (not shown) composed of Ti (lower layer)/TiN (upper layer) is formed across the entire surface and then a tungsten layer is formed across the entire surface based on blanket tungsten CVD. Subsequently, planarization treatment based on CMP is carried out, so that contact plugs 44A and 44B can be formed in the contact plug formation openings 43A and 43B (see FIG. 5B).

SUMMARY OF THE INVENTION

In the case of the insulated gate field effect transistor obtained by such a manufacturing method, the interlayer insulating layer 142 composed of $SiO_2$ is formed by CVD across the entire surface in [Step-30] (see FIG. 5A). Typically, in the composition of the source gas used in the CVD, oxygen atoms or oxygen molecules are contained. Therefore, in the formation of the interlayer insulating layer 142 composed of $SiO_2$, the oxygen atoms or oxygen molecules in the atmosphere pass through the conductive material layer 32, the barrier layer, the work function control layer 31, and the gate insulating film 30, and reach a partial portion of the silicon semiconductor substrate 11 facing the gate electrode 23, so that this partial portion of the silicon semiconductor substrate 11 is oxidized. In FIGS. 5A and 5B, this oxidized partial portion of the silicon semiconductor substrate 11 is indicated by reference numeral 30A.

The occurrence of such a phenomenon is eventually equivalent to increase in the film thickness of the gate insulating film 30, which results in the deterioration of characteristics of the insulated gate field effect transistor, such as the lowering of the gate capacitance.

There is a need for the present invention to provide a method for manufacturing an insulated gate field effect transistor, free from oxidation of a partial portion of a base facing a gate electrode at the time of formation of an interlayer insulating layer above the gate electrode.

A method for manufacturing an insulated gate field effect transistor according to a first mode of the present invention (hereinafter, abbreviated as the manufacturing method according to the first mode of the present invention) includes the steps of (a) preparing a base that includes source/drain regions, a channel forming region, a gate insulating film formed on the channel forming region, an insulating layer covering the source/drain regions, and a gate electrode formation opening provided in a partial portion of the insulating layer above the channel forming region, (b) forming a gate electrode by burying a conductive material layer in the gate electrode formation opening, (c) removing the insulating layer, and (d) depositing a first interlayer insulating layer and a second interlayer insulating layer sequentially across the entire surface. In the step (d), the first interlayer insulating layer is deposited in a deposition atmosphere containing no oxygen atom.

In the manufacturing method according to the first mode of the present invention, the first interlayer insulating layer and the second interlayer insulating layer are sequentially deposited, specifically, on the gate electrode and the source/drain regions across the entire surface.

A method for manufacturing an insulated gate field effect transistor according to a second mode of the present invention (hereinafter, abbreviated as the manufacturing method according to the second mode of the present invention) includes the steps of (a) preparing a base that includes source/drain regions, a channel forming region, a gate insulating film formed on the channel forming region, an insulating layer covering the source/drain regions, and a gate electrode formation opening provided in a partial portion of the insulating layer above the channel forming region, (b) forming a gate electrode by burying a conductive material layer in the gate electrode formation opening, and (c) depositing a first interlayer insulating layer and a second interlayer insulating layer sequentially across the entire surface. In the step (c), the first interlayer insulating layer is deposited in a deposition atmosphere containing no oxygen atom.

In the manufacturing method according to the second mode of the present invention, the first interlayer insulating layer and the second interlayer insulating layer are sequentially deposited, specifically, on the gate electrode and the insulating layer across the entire surface.

In the step (d) of the manufacturing method according to the first mode of the present invention, and in the step (c) of the manufacturing method according to the second mode of the present invention, the second interlayer insulating layer can be deposited in a deposition atmosphere containing an oxygen atom. In this case, it is desirable that the first interlayer insulating layer be composed of a silicon nitride (SiN) or a silicon carbide (SiC) and the second interlayer insulating layer be composed of a silicon oxide ($SiO_x$).

In the manufacturing methods including the above-described preferred configuration according to the first and second modes of the present invention, a configuration can also be employed in which the insulating layer is formed of the lower insulating layer and the upper insulating layer formed on this lower insulating layer and the lower insulating layer covers at least the source/drain regions. In the manufacturing method according to the first mode of the present invention, it is preferable that the upper insulating layer be removed and the lower insulating layer be left in the step (c). Furthermore, in these cases, it is desirable that the lower insulating layer be composed of the same material as that of the first interlayer insulating layer and the upper insulating layer be composed of the same material as that of the second interlayer insulating layer, but this configuration imposes no limitation. Specifically, it is desirable that the first interlayer insulating layer and the lower insulating layer be composed of a silicon nitride (SiN) or a silicon carbide (SiC) and the second interlayer insulating layer and the upper insulating layer be composed of a silicon oxide ($SiO_x$). If the insulating layer is formed of the lower insulating layer and the upper insulating layer, in the manufacturing method according to the first mode of the present invention, the first interlayer insulating layer and the second interlayer insulating layer are sequentially deposited, specifically, on the gate electrode and the lower insulating layer across the entire surface. On the other hand, in the manufacturing method according to the second mode of the present invention, the first interlayer insulating layer and the second interlayer insulating layer are sequentially deposited, specifically, on the gate electrode and the upper insulating layer across the entire surface.

It is preferable for the base to further include a side wall film that defines the side face of the gate electrode formation opening. Furthermore, it is desirable that the material of at least one partial portion of the side wall film be different from the material of the insulating layer (or the upper insulating layer). Specifically, e.g. SiN can be used as the material of the partial portion of the side wall film in contact with the side surface of the gate electrode. If the insulating layer is formed of the lower insulating layer and the upper insulating layer, the lower insulating layer may extend on the side surface of the side wall film. In the present specification, an insulating layer covering source/drain regions and a side wall film are often referred to collectively as an insulating layer. If the base has the side wall film, in the manufacturing method according to the first mode of the present invention, the first interlayer insulating layer and the second interlayer insulating layer are sequentially deposited, specifically, on the gate electrode, the side wall film, and the source/drain regions, or on the gate electrode, the side wall film, and the lower insulating layer, across the entire surface. On the other hand, in the manufacturing method according to the second mode of the present invention, the first interlayer insulating layer and the second interlayer insulating layer are sequentially deposited, specifically, on the gate electrode, the side wall film, and the insulating layer, or on the gate electrode, the side wall film, and the upper insulating layer, across the entire surface.

In the step (d) of the manufacturing method including the above-described preferred configuration according to the first mode of the present invention, and in the step (c) of the manufacturing method including the above-described preferred configuration according to the second mode of the present invention, it is preferable that the first interlayer insulating layer be deposited (formed) based on chemical vapor deposition (any of various kinds of CVD, such as plasma CVD, high-density plasma CVD, and atmospheric-pressure CVD, including atomic layer deposition (ALD)) in which a source gas with a composition containing neither an oxygen atom nor an oxygen molecule is used. On the other hand, it is preferable that the second interlayer insulating layer be deposited (formed) based on any of various kinds of CVD in which a source gas with a composition containing an oxygen atom or an oxygen molecule is used. However, embodiments of the present invention are not limited thereto, but the first interlayer insulating layer and the second interlayer insulating layer may be deposited (formed) by any of physical vapor deposition (PVD) methods such as sputtering, evaporation typified by electron-beam evaporation and hot-filament evaporation, ion plating, and laser ablation. In this case, it is preferable that the first interlayer insulating layer be deposited (formed) based on PVD in an atmosphere containing neither an oxygen atom nor an oxygen molecule and the second interlayer insulating layer be deposited (formed) based on PVD in an atmosphere containing an oxygen atom or an oxygen molecule.

In the manufacturing methods including the above-described preferred configuration according to the first and second modes of the present invention (hereinafter, these methods will be often referred to simply as the manufacturing methods of the present invention collectively), the whole of the gate electrode may be formed of the conductive material layer. Alternatively, the bottom and side portions of the gate electrode may be formed of a work function control layer for defining the work function of the gate electrode, and the center portion (remaining portion) surrounded by the bottom and side portions may be formed of the conductive material layer. In the latter case, it is desirable that the electric resistivity of the conductive material of the conductive material layer be lower than that of the conductive material of the work function control layer. In the former form, the forming step for the gate electrode can be simplified. In the latter form, the electric resistance of the gate electrode can be lowered. In addition, further another conductive material layer may be formed between the center and bottom portions of the gate electrode and between the center and side portions of the gate electrode. That is, the gate electrode may be formed by stacking three or more conductive material layers. As the conductive materials of the conductive material layer and the work function control layer, a conductive material is properly selected that has a favorable work function in terms of the relationship with the channel forming region of the n-channel or p-channel insulated gate field effect transistor.

As the conductive materials (metal materials) of the conductive material layer and the work function control layer, any of the following materials can be used: metals such as tungsten (W), hafnium (Hf), tantalum (Ta), titanium (Ti), molybdenum (Mo), ruthenium (Ru), nickel (Ni), and platinum (Pt) (including alloys of any of these metals); compounds of any of these metals such as nitrides; and compounds between a metal and a semiconductor material such as metal silicides. As the conductive material of the work function control layer, a material is properly selected that has a favorable work function in terms of the relationship with the channel forming region. For example, when the channel forming region is an n-type, a conductive material (metal material) containing hafnium (Hf), tantalum (Ta), or the like can be selected. When the channel forming region is a p-type, a conductive material (metal material) containing titanium (Ti), molybdenum (Mo), ruthenium (Ru), nickel (Ni), platinum (Pt), or the like can be selected. However, the material is not limited thereto. When the conductive material layer is formed by using a silicide, the work function of the gate electrode of the n-channel insulated gate field effect transistor and the p-channel insulated gate field effect transistor can be optimized by controlling the kind and amount of an impurity contained in the silicide, or by ion-implanting e.g. aluminum ions in the silicide. The gate electrode can be formed by a known damascene process. Specifically, in the damascene process, the conductive material layer is buried in the gate electrode formation opening by carrying out any of the following deposition methods alone or in arbitrary combination: various kinds of PVD such as evaporation typified by electron-beam evaporation and hot-filament evaporation, sputtering, ion plating, and laser ablation; various kinds of CVD including ALD and MOCVD; and plating such as electrolytic plating and electroless plating. Subsequently, planarization treatment is carried out by chemical mechanical polishing (CMP), etch-back, or the like.

The removal of the insulating layer is carried out based on a method suitable for the material of the insulating layer. Examples of the method include dry etching and wet etching with use of a proper etchant.

In the manufacturing methods of the present invention, the gate insulating film may be formed after the gate electrode formation opening is formed in the insulating layer. Alternatively, the insulating layer and the gate electrode formation opening may be formed after the gate insulating film is formed. In the latter case, the gate electrode formation opening should be formed in such a way that the gate insulating film is left at the bottom of the opening. Examples of the material of the gate insulating film include, in addition to $SiO_2$-based materials and SiN-based materials, which have been generally used in related arts, so-called high relative dielectric constant materials of which relative dielectric constant k ($=\epsilon/\epsilon_0$) is substantially 4.0 or higher. Examples of the high relative dielectric constant material include zirconium oxide ($ZrO_2$), hafnium oxide ($HfO_2$), aluminum oxide ($Al_2O_3$), yttrium oxide ($Y_2O_3$), and lanthanum oxide ($La_2O$). In addition, the examples further include metal silicates such as HfSiO, ZrSiO, AlSiO, and LaSiO. The gate insulating film may be formed by using either one kind of material or plural kinds of materials. Furthermore, the gate insulating film may be formed as either a single film (encompassing a composite film composed of plural materials) or multilayer film. The gate insulating film of the n-channel insulated gate field effect transistor and that of the p-channel insulated gate field effect transistor can be formed by using either the same material or materials different from each other. The gate insulating film can be formed by a well-known method. In particular, CVD encompassing ALD and metal organic chemical vapor deposition (MOCVD) can be used as a method for forming the gate insulating film composed of the above-described high relative dielectric constant material.

In the manufacturing methods of the present invention, examples of the material of the insulating layer include, besides the above-described $SiO_2$ and SiN, SiON, SiOF, SiC, and low dielectric constant insulating materials of which dielectric constant k ($=\epsilon/\epsilon_0$) is e.g. 3.5 or lower, such as organic SOG, polyimide-based resin, and fluorine-based resin (e.g., fluorocarbon, amorphous tetrafluoroethylene, polyarylether, arylether fluoride, polyimide fluoride, parylene, benzocyclobutene, amorphous carbon, cycloperfluorocarbon polymer, and fluorofullerene). It is also possible for the insulating layer to be formed by using a multilayer structure formed of any of these materials.

In partial portions of the interlayer insulating layers located above the channel forming region and the source/drain regions, contact plugs connected to the gate electrode and the source/drain regions may be formed. Examples of the material of the contact plugs include polycrystalline silicon doped with an impurity and refractory metal materials such as tungsten (W). The contact plugs can be formed by providing contact plug formation openings in the interlayer insulating layers by dry etching such as RIE and then filling the contact plug formation openings with the above-described material by a known method. Specifically, for example, the contact plugs can be formed by burying tungsten in the contact plug formation openings by blanket tungsten CVD and then removing the excess tungsten layer on the interlayer insulating layer. A form is also available in which a Ti layer and a TiN layer as an adhesion layer are formed inside the contact plug formation openings and then tungsten is buried in the contact plug formation openings by blanket tungsten CVD.

It is desirable that the top surfaces of the source/drain regions be formed of a silicide layer for reduced contact resistance.

As the base that is used in the manufacturing methods of the present invention and includes the source/drain regions, the channel forming region, and so on, besides a semiconductor substrate such as a silicon semiconductor substrate, a support member of which surface has a semiconductor layer (e.g., a glass substrate, quartz substrate, silicon semiconductor substrate of which surface has an insulating material layer, plastic substrate, or plastic film) can be used. The insulated gate field effect transistor is formed in e.g. a well region or the like in a semiconductor substrate or semiconductor layer. A so-called element isolation region having e.g. a trench structure may be formed between the insulated gate field effect transistors. The element isolation region may have a LOCOS structure, or may be based on the combination of a trench structure and a LOCOS structure. More alternatively, the base having an SOI structure arising from SIMOX or substrate bonding may be used. A known method can be used as a method for preparing the base that includes the source/drain regions, the channel forming region, the gate insulating film formed on the channel forming region, the insulating layer covering the source/drain regions, and the gate electrode formation opening provided in a partial portion of the insulating layer above the channel forming region, i.e., a method for fabricating such a base.

The term "channel forming region" indicates not only a region in which the channel is actually formed but also a region in which the channel will be possibly formed. For example, partial portions of a semiconductor layer and a semiconductor substrate located to face the gate electrode correspond to the "channel forming region." Furthermore, the "gate electrode" encompasses not only the electrode portion facing the "channel forming region" but also a lead-out electrode part as an extension from this electrode portion. An insulated gate field effect transistor manufactured by the manufacturing methods of the present invention may be e.g. a CMOS semiconductor device formed of an n-channel MOS and a p-channel MOS, instead of an n-channel MISFET and a p-channel MISFET. Alternatively, it may be a BiCMOS semiconductor device including a bipolar transistor in addition to an n-channel MOS and a p-channel MOS.

In the manufacturing methods of the present invention, the first interlayer insulating layer and the second interlayer insulating layer are sequentially deposited across the entire surface after the gate electrode is formed. In this deposition, the first interlayer insulating layer is deposited in a deposition atmosphere containing no oxygen atom. This feature can surely prevent the occurrence of a phenomenon of oxidation of a partial portion of the base (e.g., a silicon semiconductor substrate) facing the gate electrode, and thus can surely avoid the occurrence of a problem of the deterioration of characteristics of the insulated gate field effect transistor, such as the lowering of the gate capacitance.

In the manufacturing method according to the first mode of the present invention, the configuration of the components above the gate electrode (the configuration of the interlayer insulating layers) can be made substantially the same as that of the components above the source/drain regions (the configuration of the insulating layer+the interlayer insulating layers). Thus, the contact plug formation openings can be easily formed for the provision of the contact plugs for the gate electrode and the source/drain regions.

Furthermore, in the manufacturing methods of the present invention, if the insulating layer is formed of the lower insulating layer and the upper insulating layer, it is possible to make the lower insulating layer function as a liner layer, and thus stress can be applied to the channel forming region. As a result, the driving ability of the insulated gate field effect transistor can be enhanced. Moreover, in the manufacturing method according to the first mode of the present invention, the upper insulating layer is removed whereas the lower insulating layer is left. Therefore, in this insulating layer removal, no damage occurs to the source/drain regions.

DETAILED DESCRIPTION OF THE PREFERRED EMBODIMENTS

Embodiments of the present invention will be described below with reference to the accompanying drawings.

First Embodiment

A first embodiment of the present invention relates to a method for manufacturing an insulated gate field effect transistor according to the first mode of the present invention.

Figure 1A:
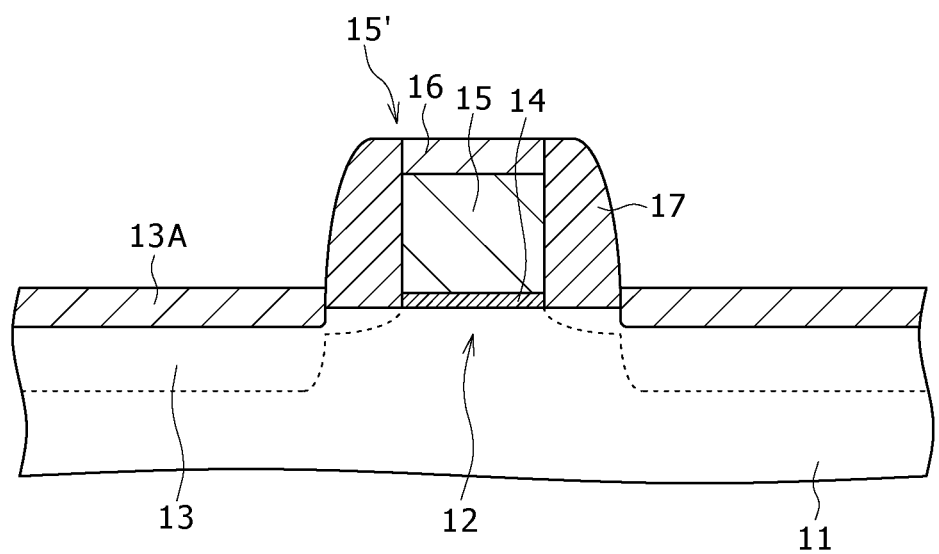
FIGS. 1A to 1I are schematic partial end views of a semiconductor substrate and so on, for explaining a method for manufacturing an insulated gate field effect transistor according to a first embodiment of the present invention.
Figure 1B:
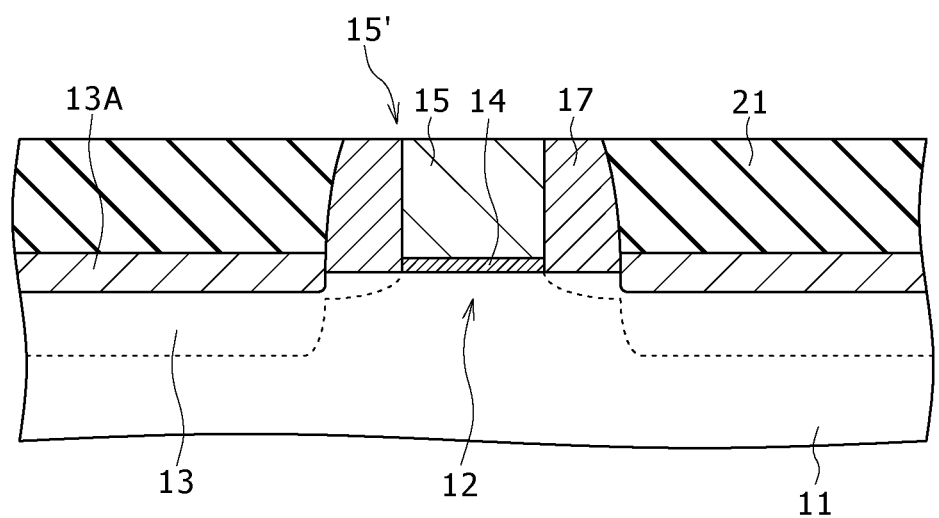
Figure 1C:
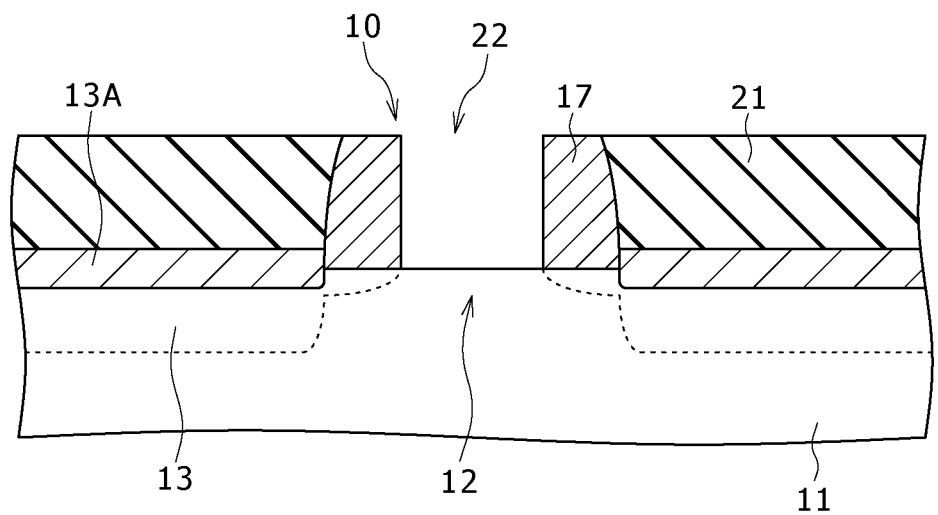
Figure 1D:
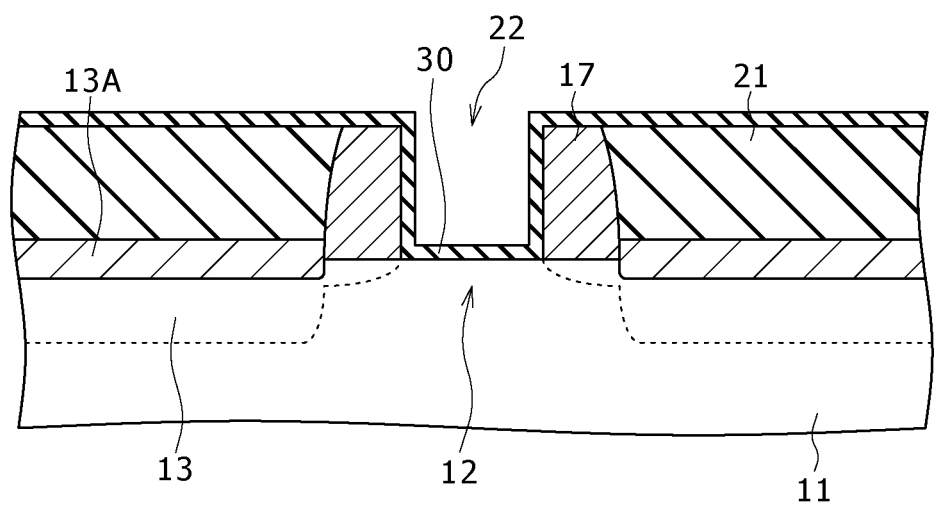
Figure 1E:
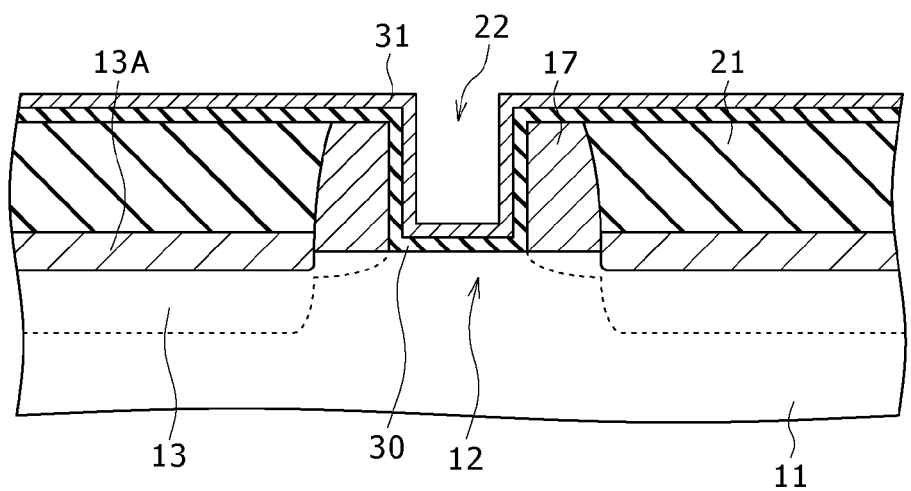
Figure 1F:
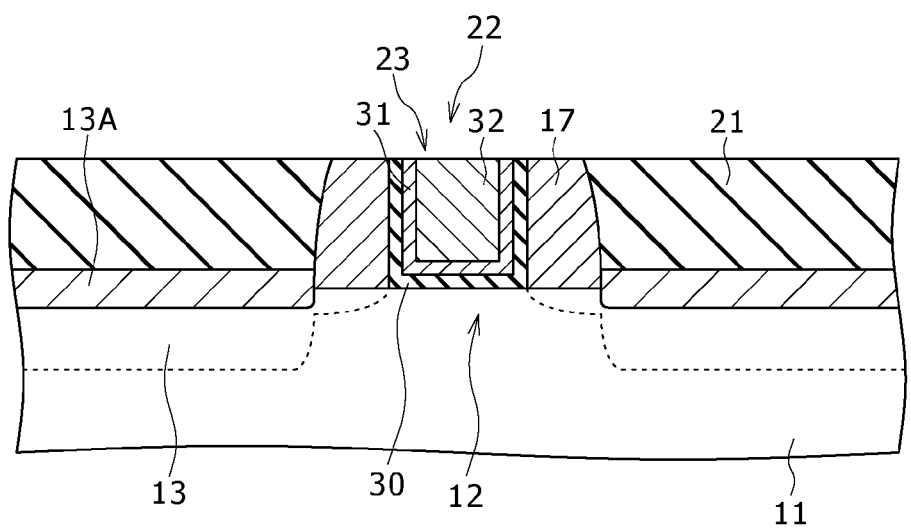
Figure 1G:
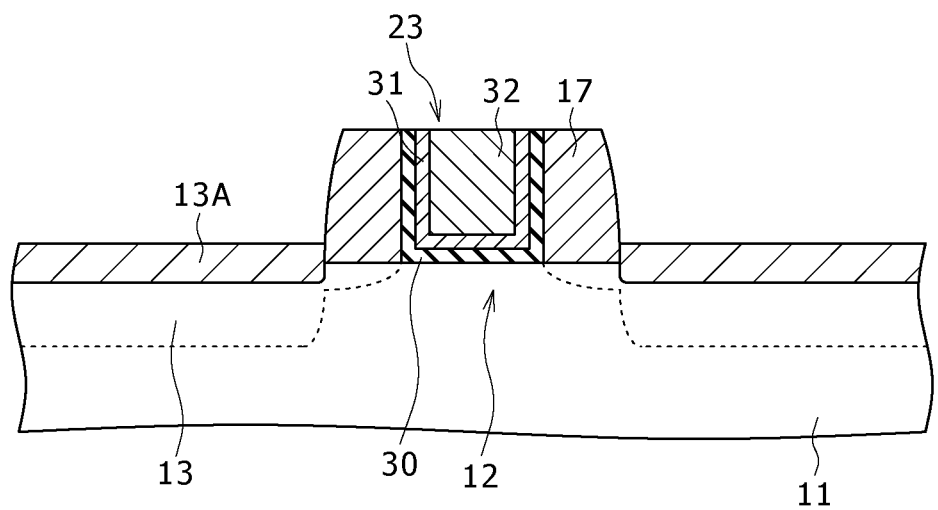
Figure 1H:
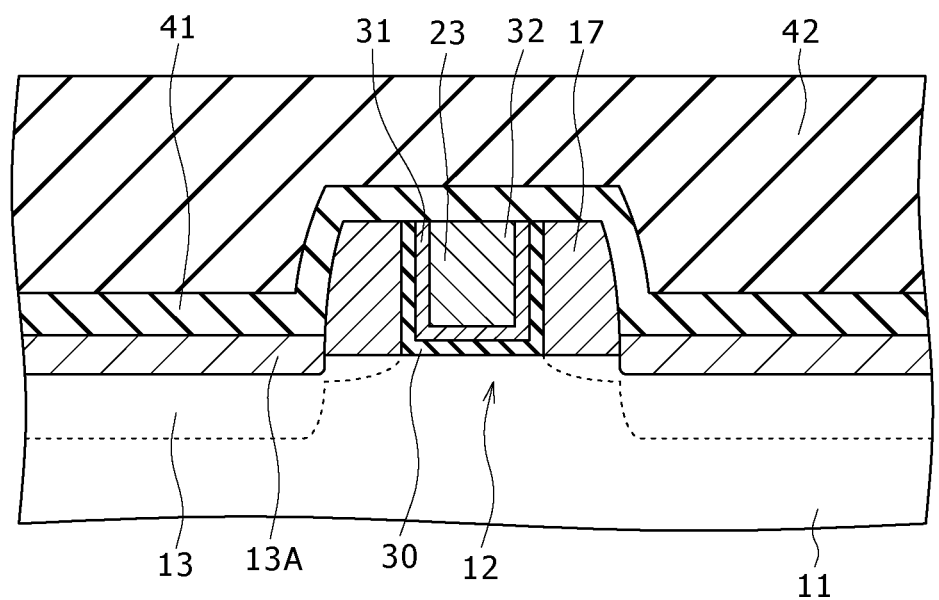
Figure 1I:
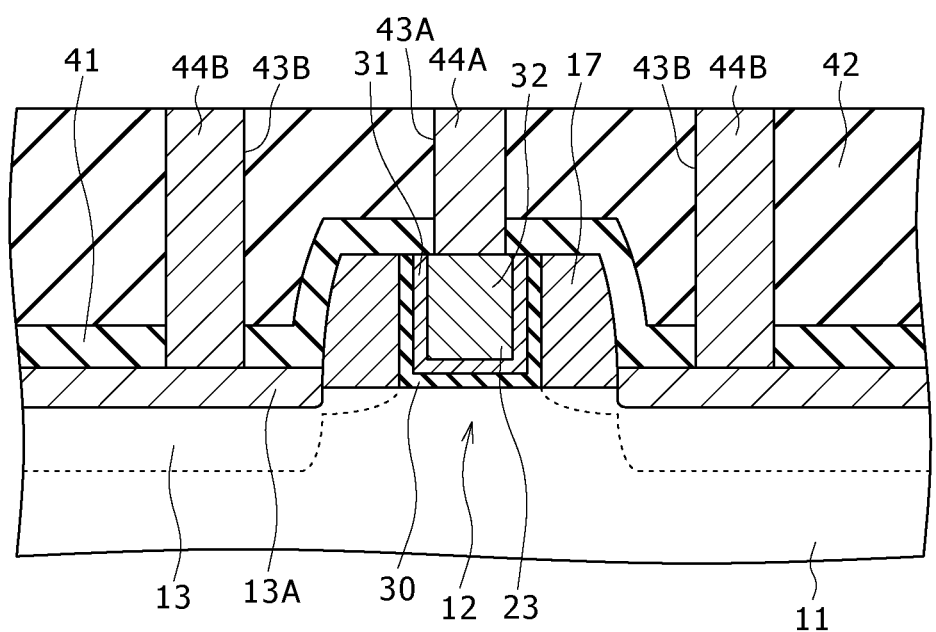

As shown in the schematic partial end view of FIG. 1I, an insulated gate field effect transistor obtained by the method for manufacturing an insulated gate field effect transistor according to the first embodiment includes (A) source/drain regions 13 and a channel forming region 12, (B) a gate electrode 23 formed above the channel forming region 12, and (C) a gate insulating film 30. In the first embodiment, and in second to fourth embodiments of the present invention, which will be described later, an n-channel insulated gate field effect transistor is formed.

The gate insulating film 30 is composed of hafnium oxide. The gate electrode 23 is formed of a work function control layer 31 and a conductive material layer 32. The work function control layer 31 is composed of a conductive material (metal material) for defining the work function of the gate electrode 23, and specifically composed of hafnium silicide, i.e., $HfSi_x$. The conductive material layer 32 is composed of a conductive material (metal material, specifically tungsten (W)) different from that of the work function control layer 31. The work function control layer 31 is formed across the bottom and side portions of the gate electrode 23 facing the channel forming region 12, and the conductive material layer 32 occupies the remaining portion of the gate electrode 23. In the insulated gate field effect transistor of the first embodiment, the side portion of the gate electrode 23 is in contact with a side wall film 17 composed of SiN. Around the surfaces of the source/drain regions 13, a silicide layer (specifically, a nickel silicide layer) 13A is formed. This is the same also in the second to fourth embodiments to be described later.

On the source/drain regions 13, the side wall film 17, and the gate electrode 23, a first interlayer insulating layer 41 composed of silicon nitride (SiN) is deposited (formed). On the first interlayer insulating layer 41, a second interlayer insulating layer 42 composed of silicon oxide ($SiO_x$, e.g., X=2) is deposited (formed). Furthermore, a contact plug formation opening 43A is provided in partial portions of the first interlayer insulating layer 41 and the second interlayer insulating layer 42 located above the channel forming region 12. In this contact plug formation opening 43A, a contact plug 44A that is composed of tungsten and connected to the top of the gate electrode 23 is provided. In addition, contact plug formation openings 43B are provided in partial portions of the first interlayer insulating layer 41 and the second interlayer insulating layer 42 located above the source/drain regions 13. In these contact plug formation openings 43B, contact plugs 44B that are composed of tungsten and connected to the silicide layer 13A of the source/drain regions 13 are provided. Reference numeral 11 denotes a silicon semiconductor substrate.

The method for manufacturing an insulated gate field effect transistor according to the first embodiment will be described below, with reference to FIGS. 1A to 1I, which are schematic partial end views of the silicon semiconductor substrate and so on.

[Step-100]

Initially, a base 10 is prepared that includes the source/drain regions 13, the channel forming region 12, the gate insulating film 30 formed on the channel forming region 12, an insulating layer 21 that is composed of $SiO_2$ and covers the source/drain regions 13, and a gate electrode formation opening 22 that is provided in a partial portion of the insulating layer 21 above the channel forming region 12.

Specifically, after element isolation regions (not shown) are formed in the silicon semiconductor substrate 11, a dummy gate insulating film 14 is formed on the surface of the silicon semiconductor substrate 11, and then a dummy poly-silicon layer 15 and a hard mask layer composed of SiN are sequentially formed. Subsequently, a dummy gate electrode 15' is formed based on photolithography and dry etching. The dummy gate electrode 15' has a multilayer structure formed of the dummy poly-silicon layer 15 and the hard mask 16. Subsequently, after shallow ion implantation of an impurity for forming an LDD structure is carried out, a SiN layer for forming the side wall film 17 is formed on the side surface of the dummy gate electrode 15', and the SiN layer is etched back. This can form the side wall film 17 composed of SiN. Thereafter, deep ion implantation of an impurity is carried out to thereby form the source/drain regions 13. Subsequently, a nickel layer is deposited across the entire surface and heat treatment is carried out to thereby turn upper part of the source/drain regions 13 into a silicide. This can form the silicide layer 13A composed of a nickel silicide. Thereafter, the unreacted nickel layer is removed and heat treatment is carried out again, to thereby stabilize the silicide layer 13A. Through this step, the source/drain regions 13 having extension regions and the silicide layer 13A (low-resistance layer) can be obtained. The region sandwiched between the extension regions of the source/drain regions 13 serves as the channel forming region 12. In this manner, the state shown in FIG. 1A can be obtained.

Thereafter, the insulating layer 21 composed of $SiO_2$ is formed across the entire surface, and then planarization treatment is carried out based on CMP, to thereby remove a partial portion of the insulating layer 21 and the hard mask 16 (and further a partial portion of the dummy poly-silicon layer 15 and a partial portion of the side wall film 17, depending on the case). Through this step, the state shown in FIG. 1B can be obtained.

Subsequently, the exposed dummy gate electrode 15' is removed by etching in which a radical of fluorine or the like is used, and the dummy gate insulating film 14 is removed by wet etching employing e.g. a dilute hydrofluoric acid. Thus, the state shown in FIG. 1C can be obtained.

Subsequently, the gate insulating film 30 is formed on the channel forming region 12 exposed through the bottom of the gate electrode formation opening 22. In the first embodiment, initially the gate insulating film 30 is formed on the channel forming region 12 exposed through the bottom of the gate electrode formation opening 22 and the side surface of the gate electrode formation opening 22. Specifically, the gate insulating film 30 that is composed of hafnium oxide and has a thickness of 3.0 nm is formed across the entire surface (see FIG. 1D). This gate insulating film 30 can be formed based on e.g. CVD in which an organic-based Hf gas is used as the source gas. Alternatively, it can be formed by forming a hafnium film based on sputtering employing a hafnium target and then oxidizing the hafnium film. More alternatively, it can be formed based on ALD.

[Step-110]

After the formation of the gate insulating film 30, the gate electrode 23 is formed by burying a conductive material layer in the gate electrode formation opening 22. In the first embodiment, the gate electrode 23 is formed of the work function control layer 31 composed of a conductive material (metal material) and the conductive material layer 32 composed of a conductive material (metal material) different from that of the work function control layer 31. Therefore, specifically, the work function control layer 31 that is composed of hafnium silicide ($HfSi_x$) and has a thickness of 15 nm is initially formed based on sputtering across the entire surface (specifically, on the gate insulating film 30) (see FIG. 1E).

Thereafter, the remaining part of the gate electrode formation opening 22 is filled with the conductive material layer 32, so that the gate electrode 23 formed of the work function control layer 31 and the conductive material layer 32 is obtained. More specifically, initially a barrier layer (not shown) composed of TiN is formed based on sputtering across the entire surface. The barrier layer with a thickness of 10 nm can be formed based on CVD, sputtering, or ALD (in which a $NH_3$ gas and a $TiCl_4$ gas are alternately used) Thereafter, the conductive material layer 32 that is composed of tungsten and has a thickness of 0.2 μm is formed across the entire surface based on so-called blanket tungsten CVD. Subsequently, planarization treatment based on CMP is carried out to remove the conductive material layer 32, the barrier layer, the work function control layer 31, and the gate insulating film 30 over the insulating layer 21 and the side wall film 17 (see FIG. 1F). In this manner, the gate electrode 23 can be obtained. The gate electrode 23 is formed above the channel forming region 12 with the intermediary of the gate insulating film 30 therebetween and is formed of the work function control layer 31, the barrier layer, and the conductive material layer 32.

[Step-120]

After the formation of the gate electrode 23, the insulating layer 21 is removed (see FIG. 1G). Specifically, the insulating layer 21 can be removed based on dry etching in which a $C_4F_8$ gas and an Ar gas are used.

[Step-130]

Thereafter, the first interlayer insulating layer 41 and the second interlayer insulating layer 42 are sequentially deposited across the entire surface. Specifically, the first interlayer insulating layer 41 and the second interlayer insulating layer 42 are sequentially deposited over the gate electrode 23, the side wall film 17 and the source/drain regions 13 (more specifically, the silicide layer 13A). Subsequently, planarization treatment for the second interlayer insulating layer 42 is carried out. As a result, the structure shown in FIG. 1H can be obtained. The first interlayer insulating layer 41 is deposited in a deposition atmosphere containing no oxygen atom. The second interlayer insulating layer 42 is deposited in a deposition atmosphere containing oxygen atoms. More specifically, the first interlayer insulating layer 41 is deposited based on CVD in which a source gas with a composition containing neither oxygen atoms nor oxygen molecules is used, and then the second interlayer insulating layer 42 is deposited based on CVD in which a source gas with a composition containing oxygen atoms or oxygen molecules is used. Examples of the film deposition conditions are shown in Tables 1 and 2.

TABLE 1

Condition of film deposition of first interlayer insulating layer 41 based on plasma CVD

| | |
|---|---|
| Source gas: | $SiH_4/NH_3/N_2$ = 30 to 800 sccm/30 to 800 sccm/3000 to 5000 sccm |
| Temperature: | 400° C. or lower |
| Pressure: | $4 \times 10^2$ Pa to $1.3 \times 10^3$ Pa |

TABLE 2

Condition of film deposition of second interlayer insulating layer 42 based on plasma TEOS-CVD

| | |
|---|---|
| Source gas: | TEOS gas/$O_2$ = 500 to 1000 sccm/400 to 1000 sccm |
| Temperature: | 400° C. or lower |
| Pressure: | $4 \times 10^2$ Pa to $1.3 \times 10^3$ Pa |

[Step-140]

After the deposition of the layers 41 and 42, based on photolithography and dry etching, the contact plug formation openings 43A and 43B are formed in the first interlayer insulating layer 41 and the second interlayer insulating layer 42 above the gate electrode 23 and above the source/drain regions 13. Subsequently, a second barrier layer (not shown) formed of a multilayer structure of Ti (lower layer)/TiN (upper layer) is formed based on sputtering across the entire surface, and then a tungsten layer is formed across the entire surface based on blanket tungsten CVD employing a $WF_6$ gas, $H_2$ gas, and $SiH_4$ gas (at a deposition temperature of 400° C.). Subsequently, planarization treatment based on CMP is carried out, so that the contact plugs 44A and 44B can be formed in the contact plug formation openings 43A and 43B (see FIG. 1I). Thereafter, interconnects and so on (not shown) are formed on the second interlayer insulating layer 42 according to need, so that the insulated gate field effect transistor of the first embodiment can be completed.

In the first embodiment, the first interlayer insulating layer 41 is deposited in a deposition atmosphere containing no oxygen atom in [Step-130]. This feature can surely prevent the occurrence of a phenomenon of oxidation of a partial portion of the base (silicon semiconductor substrate 11) facing the gate electrode 23, and thus can surely avoid the occurrence of a problem of the deterioration of characteristics of the insulated gate field effect transistor, such as the lowering of the gate capacitance. Furthermore, the configuration of the components above the gate electrode 23 (the configuration of the interlayer insulating layers 41 and 42) is the same as that of the components above the source/drain regions 13 (the configuration of the interlayer insulating layers 41 and 42). Therefore, in [Step-140] the contact plug formation openings 43A and 43B can be easily formed for the provision of the contact plugs 44A and 44B for the gate electrode 23 and the source/drain regions 13.

Second Embodiment

The second embodiment is a modification of the first embodiment. In the second embodiment, the insulating layer is formed of a lower insulating layer 21A and an upper insulating layer 21B formed on this lower insulating layer 21A. The lower insulating layer 21A covers at least the source/drain regions 13 (specifically, the source/drain regions 13 and the side wall film 17). In the step of removing the insulating layer, the upper insulating layer 21B is removed whereas the lower insulating layer 21A is left. The lower insulating layer 21A is composed of the same material as that of the first interlayer insulating layer 41, specifically, SiN. The upper insulating layer 21B is composed of the same material as that of the second interlayer insulating layer 42, specifically, $SiO_x$ (X=2). As the film deposition condition for the lower insulating layer 21A composed of SiN, the same condition as that shown in Table 1 can be employed. Examples of the film deposition condition for the upper insulating layer 21B composed of $SiO_2$ are shown in Tables 3 and 4.

TABLE 3

Condition of film deposition of upper insulating layer 21B based on high-density plasma CVD

| | |
|---|---|
| Source gas: | $SiH_4/O_2$/Ar (or He or $H_2$) = 8 to 120 sccm/10 to 240 sccm/10 to 120 sccm |
| Temperature: | 400° C. or lower |
| Pressure: | $4 \times 10^2$ Pa to $1.3 \times 10^3$ Pa |

TABLE 4

Condition of film deposition of upper insulating layer 21B based on $O_3$-TEOS-CVD

| | |
|---|---|
| Source gas: | gas obtained by mixing a TEOS gas of 10 to 15 wt. % (supplied at a flow rate of 500 to 1000 milligrams/minute) in a mixture gas of $O_2$ and $O_3$ supplied at a flow rate of 5 to 10 liters/minute |
| Temperature: | 450° C. or lower |
| Pressure: | $6.7 \times 10^3$ Pa to $9.3 \times 10^4$ Pa |

The method for manufacturing an insulated gate field effect transistor according to the second embodiment will be described below, with reference to FIGS. 2A to 2I, which are schematic partial end views of the silicon semiconductor substrate and so on.

[Step-200]

Initially, a base 10 is prepared that includes the source/drain regions 13, the channel forming region 12, the gate insulating film 30 formed on the channel forming region 12, the insulating layers 21A and 21B covering the source/drain regions 13, and the gate electrode formation opening 22 that is provided in partial portions of the insulating layers 21A and 21B above the channel forming region 12.

Specifically, initially the same step as that of the former stage of [Step-100] in the first embodiment is carried out to obtain the state shown in FIG. 1A. Subsequently, the lower insulating layer 21A that is composed of SiN and is to serve as a liner layer is deposited by CVD across the entire surface based on the film deposition condition exemplified in Table 1. Thus, the state shown in FIG. 2A can be obtained. Subsequently, the upper insulating layer 21B composed of $SiO_2$ is deposited across the entire surface based on the film deposition condition exemplified in Table 3 or 4, and then planarization treatment is carried out based on CMP to thereby remove a partial portion of the upper insulating layer 21B, a partial portion of the lower insulating layer 21A, and the hard mask 16 (and further a partial portion of the dummy poly-silicon layer 15 and a partial portion of the side wall film 17, depending on the case). Through this step, the state shown in FIG. 2B can be obtained.

Subsequently, the exposed dummy gate electrode 15' is removed by etching in which a radical of fluorine or the like is used, and the dummy gate insulating film 14 is removed by wet etching employing e.g. a dilute hydrofluoric acid. Thus, the state shown in FIG. 2C can be obtained.

Figure 2A:
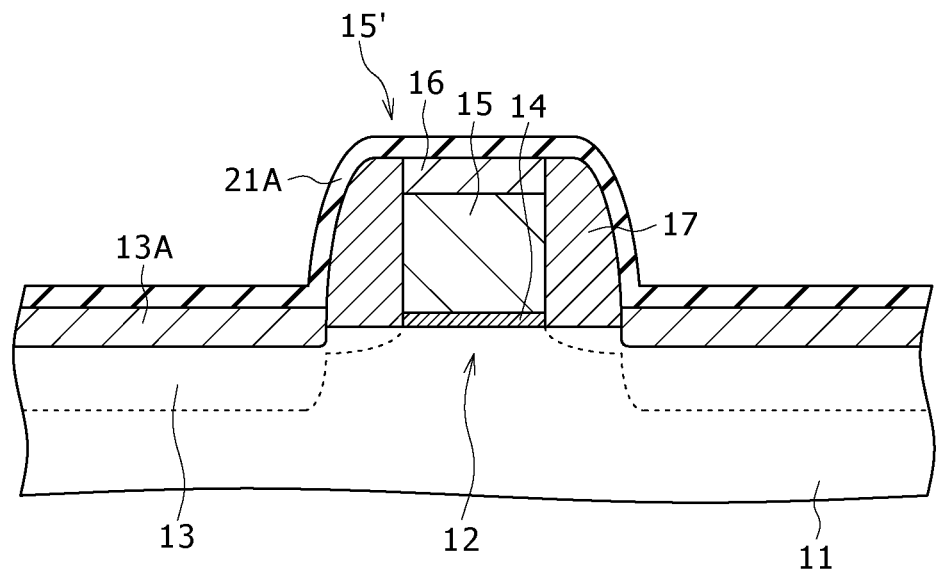
FIGS. 2A to 2I are schematic partial end views of a semiconductor substrate and so on, for explaining a method for manufacturing an insulated gate field effect transistor according to a second embodiment of the present invention.
Figure 2B:
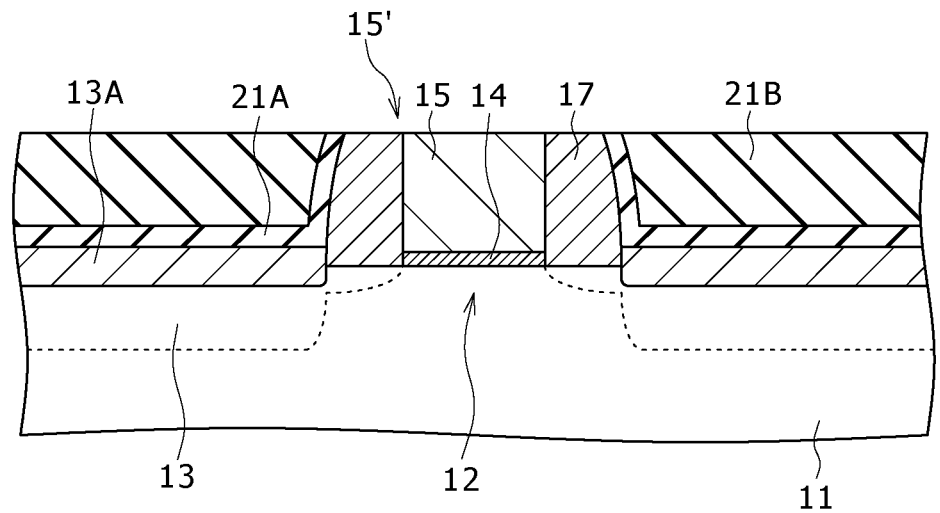
Figure 2C:
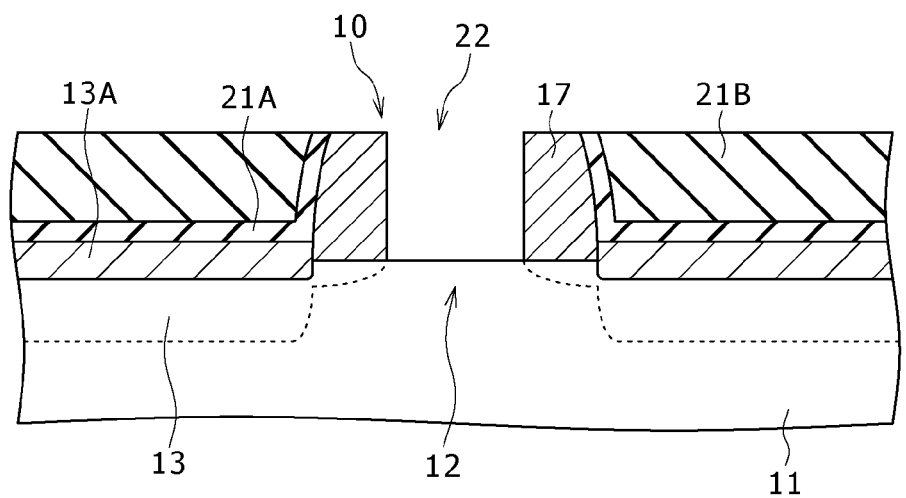
Figure 2D:
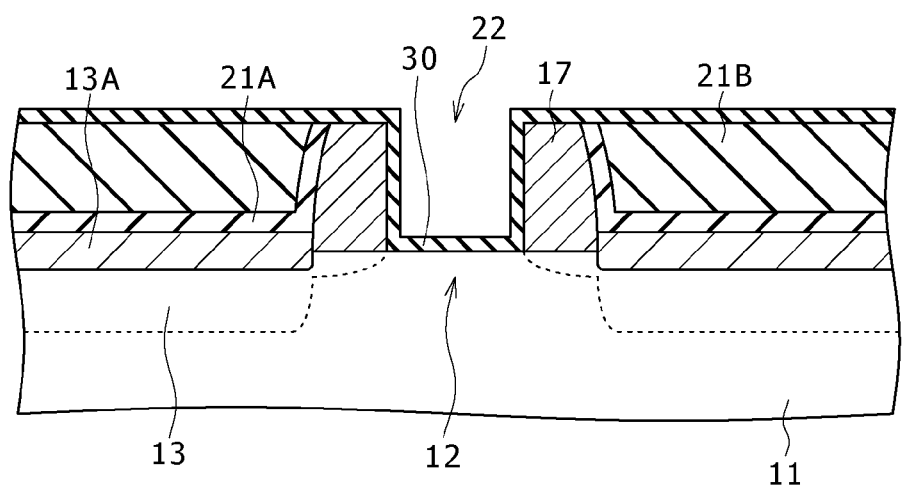

Subsequently, similarly to [Step-100] of the first embodiment, the gate insulating film 30 is formed on the channel forming region 12 exposed through the bottom of the gate electrode formation opening 22 (see FIG. 2D).

[Step-210]

Figure 2E:
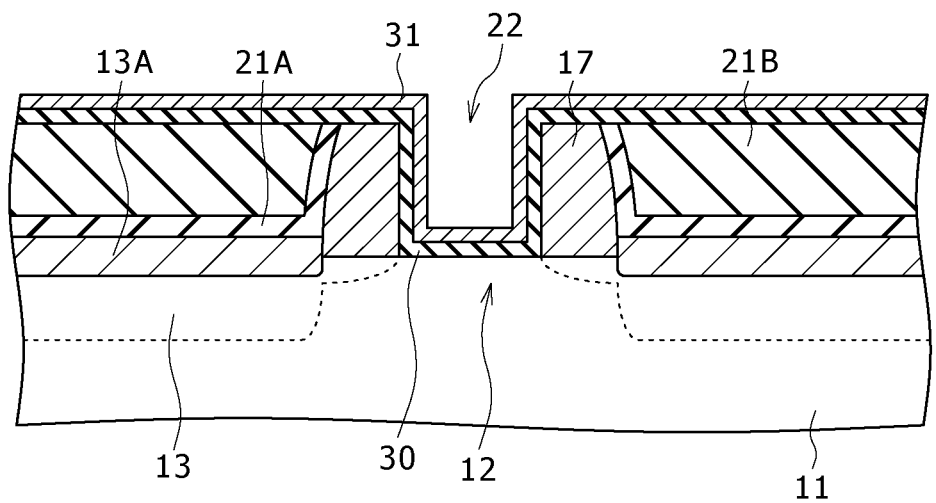
Figure 2F:
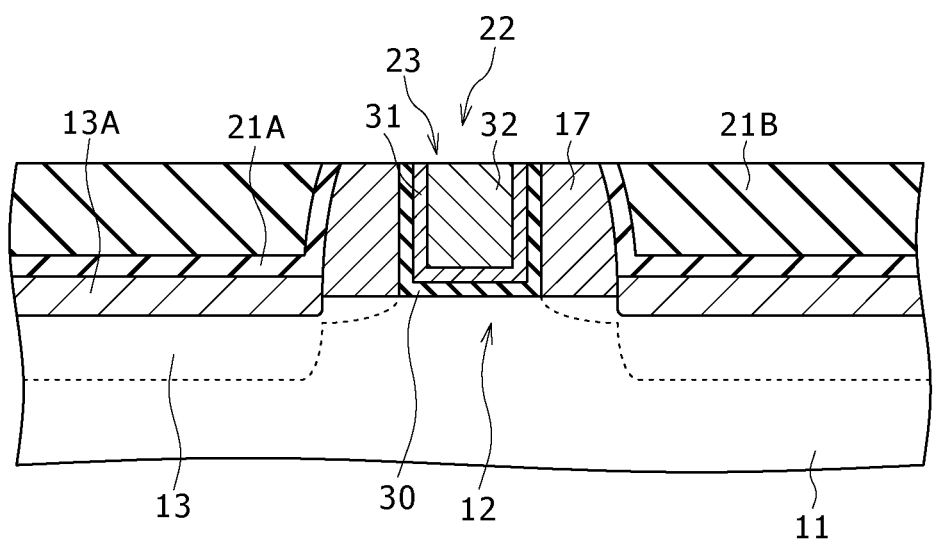

Thereafter, the gate electrode 23 is formed by filling the gate electrode formation opening 22 with the work function control layer 31 and the conductive material layer 32 (see FIGS. 2E and 2F). The gate electrode 23 is formed of the work function control layer 31, a barrier layer (not shown), and the conductive material layer 32 similarly to the first embodiment.

[Step-220]

Figure 2G:
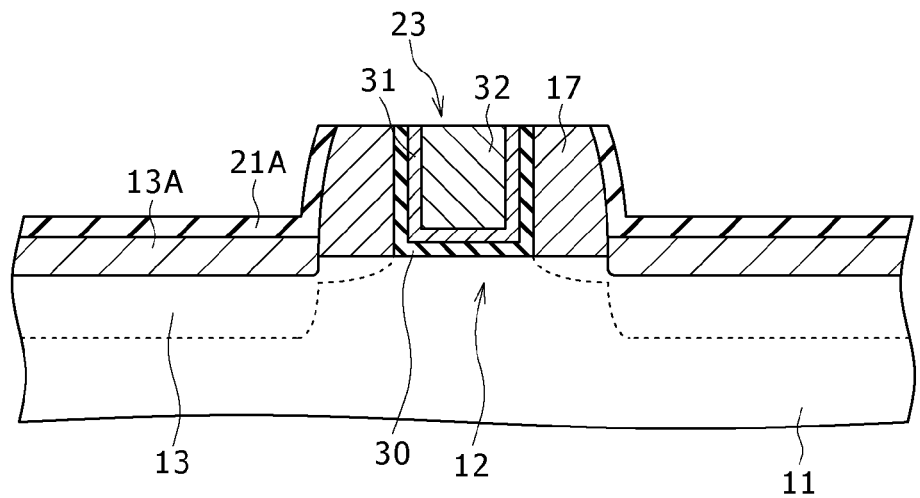
Figure 2H:
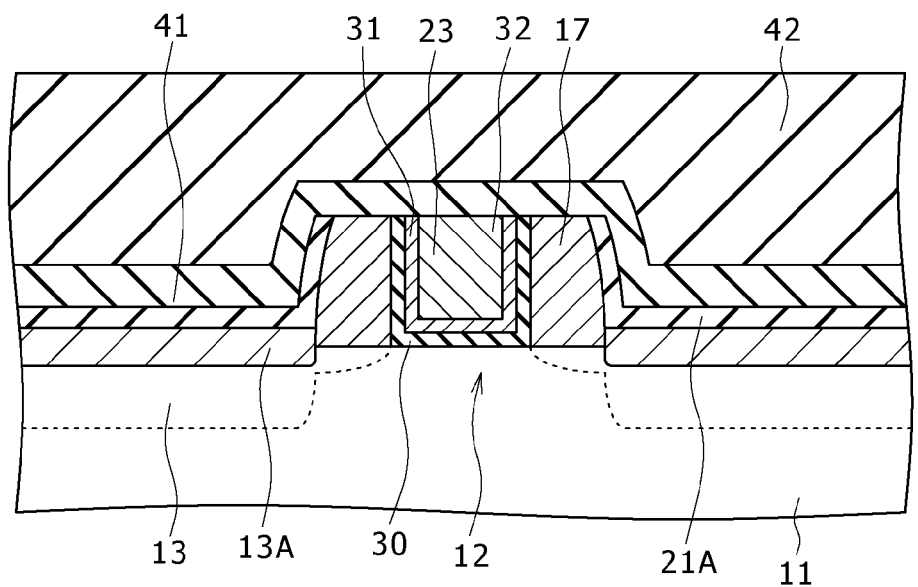

Subsequently, the upper insulating layer 21B is removed similarly to [Step-120] of the first embodiment (see FIG. 2G). The lower insulating layer 21A is left.

[Step-230]

Thereafter, the first interlayer insulating layer 41 and the second interlayer insulating layer 42 are sequentially deposited across the entire surface similarly to [Step-130] of the first embodiment. Specifically, the first interlayer insulating layer 41 and the second interlayer insulating layer 42 are sequentially deposited over the gate electrode 23, the side wall film 17, and the lower insulating layer 21A. Subsequently, planarization treatment for the second interlayer insulating layer 42 is carried out. As a result, the structure shown in FIG. 2H can be obtained.

[Step-240]

Figure 2I:
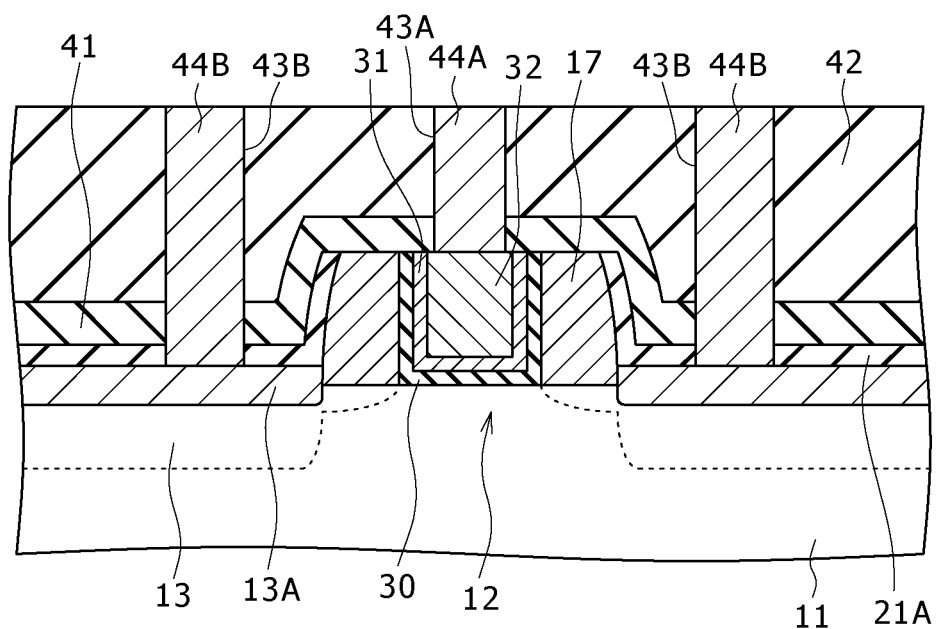

Thereafter, the contact plugs 44A and 44B are formed similarly to [Step-140] of the first embodiment (see FIG. 2I). Subsequently, interconnects and so on (not shown) are formed on the second interlayer insulating layer 42 according to need, so that the insulated gate field effect transistor of the second embodiment can be completed.

Also in the second embodiment, the first interlayer insulating layer 41 is deposited in a deposition atmosphere containing no oxygen atom in [Step-230]. This feature can surely prevent the occurrence of a phenomenon of oxidation of a partial portion of the base (silicon semiconductor substrate 11) facing the gate electrode 23, and thus can surely avoid the occurrence of a problem of the deterioration of characteristics of the insulated gate field effect transistor, such as the lowering of the gate capacitance. Furthermore, the configuration of the components above the gate electrode 23 (the configuration of the interlayer insulating layers 41 and 42) is substantially the same as that of the components above the source/drain regions 13 (the configuration of the insulating layer 21A+the interlayer insulating layers 41 and 42). Therefore, in [Step-240], the contact plug formation openings 43A and 43B can be easily formed for the provision of the contact plugs 44A and 44B for the gate electrode 23 and the source/drain regions 13. Furthermore, in [Step-220], the upper insulating layer 21B is removed whereas the lower insulating layer 21A is left. Therefore, in this insulating layer removal, no damage occurs to the source/drain regions 13. Moreover, it is possible to make the lower insulating layer 21A function as a liner layer, and thus stress can be applied to the channel forming region 12. As a result, the driving ability of the insulated gate field effect transistor can be enhanced.

Third Embodiment

The third embodiment relates to a method for manufacturing an insulated gate field effect transistor according to the second mode of the present invention.

Figure 3A:
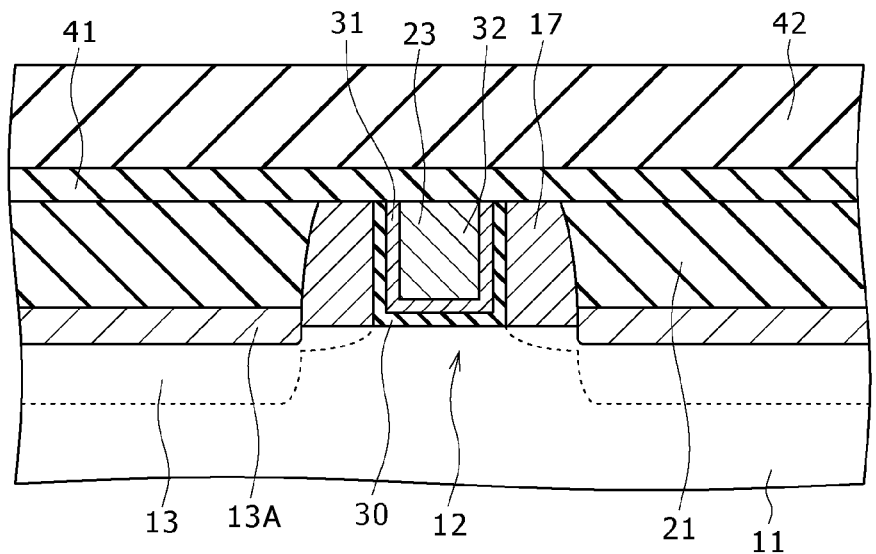
FIGS. 3A and 3B are schematic partial end views of a semiconductor substrate and so on, for explaining a method for manufacturing an insulated gate field effect transistor according to a third embodiment of the present invention.
Figure 3B:
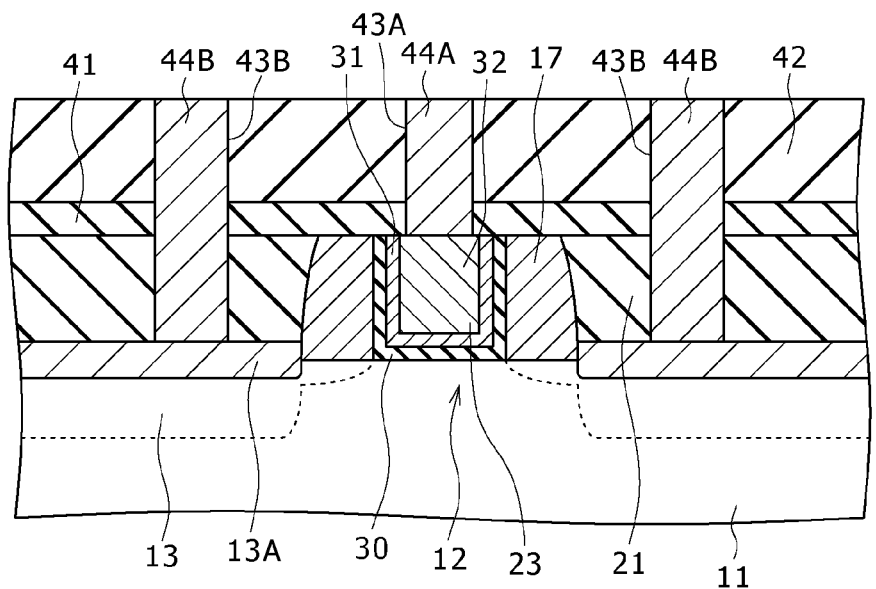

As shown in the schematic partial end view of FIG. 3B, an insulated gate field effect transistor obtained by the method for manufacturing an insulated gate field effect transistor according to the third embodiment also includes (A) source/drain regions 13 and a channel forming region 12, (B) a gate electrode 23 formed above the channel forming region 12, and (C) a gate insulating film 30.

In the third embodiment, a first interlayer insulating layer 41 composed of silicon nitride (SiN) is deposited (formed) on an insulating layer 21, a side wall film 17, and the gate electrode 23, unlike the first embodiment. On the first interlayer insulating layer 41, a second interlayer insulating layer 42 composed of silicon oxide ($SiO_x$, e.g., X=2) is deposited (formed). Furthermore, a contact plug formation opening 43A is provided in partial portions of the first interlayer insulating layer 41 and the second interlayer insulating layer 42 located above the channel forming region 12. In this contact plug formation opening 43A, a contact plug 44A that is composed of tungsten and connected to the top of the gate electrode 23 is provided. In addition, contact plug formation openings 43B are provided in partial portions of the insulating layer 21, the first interlayer insulating layer 41, and the second interlayer insulating layer 42 located above the source/drain regions 13. In these contact plug formation openings 43B, contact plugs 44B that are composed of tungsten and connected to a silicide layer 13A of the source/drain regions 13 are provided.

The method for manufacturing an insulated gate field effect transistor according to the third embodiment will be described below with reference to FIGS. 3A and 3B, which are schematic partial end views of a silicon semiconductor substrate and so on.

[Step-300]

Initially, similarly to [Step-100] of the first embodiment, a base 10 is prepared that includes the source/drain regions 13, the channel forming region 12, the gate insulating film 30 formed on the channel forming region 12, the insulating layer 21 that is composed of $SiO_2$ and covers the source/drain regions 13, and a gate electrode formation opening 22 that is provided in a partial portion of the insulating layer 21 above the channel forming region 12. Specifically, the same step as [Step-100] of the first embodiment is carried out. More specifically, after the state shown in FIG. 1A is obtained, the insulating layer 21 composed of $SiO_2$ is formed across the entire surface, and then planarization treatment is carried out based on CMP, to thereby remove a partial portion of the insulating layer 21 and a hard mask 16 (and further a partial portion of a dummy poly-silicon layer 15 and a partial portion of the side wall film 17, depending on the case). Thus, the state shown in FIG. 1B can be obtained. Subsequently, an exposed dummy gate electrode 15' is removed by etching in which a radical of fluorine or the like is used, and a dummy gate insulating film 14 is removed by wet etching employing e.g. a dilute hydrofluoric acid. Thus, the state shown in FIG. 1C can be obtained. Subsequently, the gate insulating film 30 is formed on the channel forming region 12 exposed through the gate electrode formation opening 22 (see FIG. 1D). Thereafter, the gate electrode 23 is formed by filling the gate electrode formation opening 22 with a work function control layer 31 and a conductive material layer 32 similarly to [Step-110] of the first embodiment (see FIGS. 1E and 1F). The gate electrode 23 is formed of the work function control layer 31, a barrier layer (not shown), and the conductive material layer 32 similarly to the first embodiment.

[Step-310]

After the formation of the gate electrode 23, without the removal of the insulating layer 21 unlike the first embodiment, a first interlayer insulating layer 41 and a second interlayer insulating layer 42 are sequentially deposited similarly to [Step-130] of the first embodiment across the entire surface, i.e., over the insulating layer 21, the side wall film 17, and the gate electrode 23 (see FIG. 3A).

[Step-320]

Subsequently, the contact plugs 44A and 44B are formed in the contact plug formation openings 43A and 43B similarly to [Step-140] of the first embodiment (see FIG. 3B). Thereafter, interconnects and so on (not shown) are formed on the second interlayer insulating layer 42 according to need, so that the insulated gate field effect transistor of the third embodiment can be completed.

In the third embodiment, the first interlayer insulating layer 41 is deposited in a deposition atmosphere containing no oxygen atom in [Step-310]. This feature can surely prevent the occurrence of a phenomenon of oxidation of a partial portion of the base (silicon semiconductor substrate 11) facing the gate electrode 23, and thus can surely avoid the occurrence of a problem of the deterioration of characteristics of the insulated gate field effect transistor, such as the lowering of the gate capacitance.

Fourth Embodiment

The fourth embodiment is a modification of the third embodiment. In the fourth embodiment, the insulating layer is formed of a lower insulating layer 21A and an upper insulating layer 21B formed on this lower insulating layer 21A. The lower insulating layer 21A covers at least the source/drain regions 13 (specifically, the source/drain regions 13 and the side wall film 17). The lower insulating layer 21A is composed of the same material as that of the first interlayer insulating layer 41, specifically, SiN. The upper insulating layer 21B is composed of the same material as that of the second interlayer insulating layer 42, specifically, $SiO_x$ (X=2). As the film deposition condition for the lower insulating layer 21A composed of SiN, the same condition as that shown in Table 1 can be employed. As the film deposition condition for the upper insulating layer 21B composed of $SiO_2$, the same condition as that shown in Table 3 or 4 can be employed.

Figure 4A:
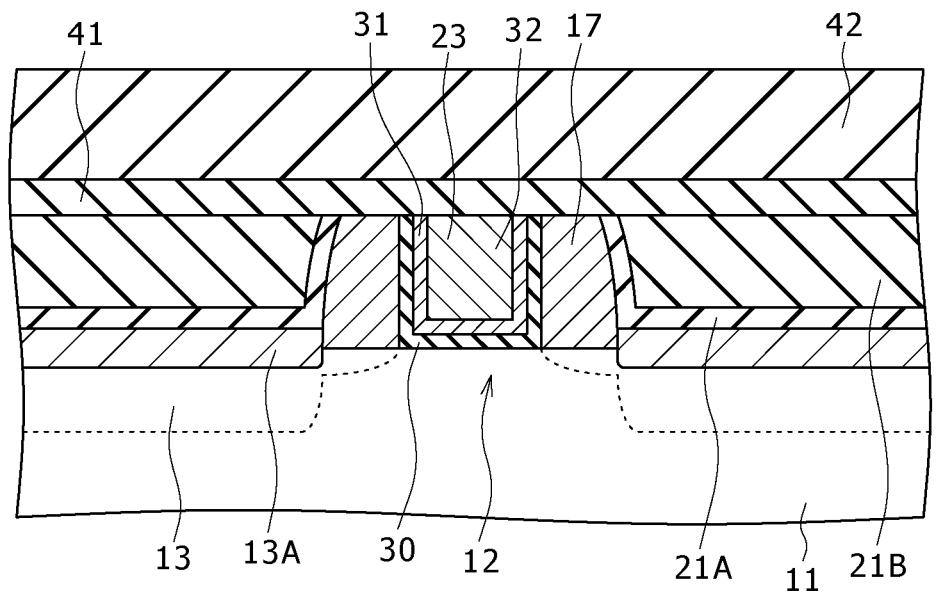
FIGS. 4A and 4B are schematic partial end views of a semiconductor substrate and so on, for explaining a method for manufacturing an insulated gate field effect transistor according to a fourth embodiment of the present invention.

The method for manufacturing an insulated gate field effect transistor according to the fourth embodiment will be described below with reference to FIGS. 4A and 4B, which are schematic partial end views of the silicon semiconductor substrate and so on.

[Step-400]

Initially, similarly to [Step-200] of the second embodiment, a base 10 is prepared that includes the source/drain regions 13, the channel forming region 12, the gate insulating film 30 formed on the channel forming region 12, the insulating layers 21A and 21B covering the source/drain regions 13, and the gate electrode formation opening 22 that is provided in partial portions of the insulating layers 21A and 21B above the channel forming region 12 (see FIGS. 2A, 2B, 2C, and 2D). Thereafter, similarly to [Step-110] of the first embodiment, the gate electrode 23 is formed by filling the gate electrode formation opening 22 with the work function control layer 31 and the conductive material layer 32 (see FIGS. 2E and 2F).

[Step-410]

Subsequently, the first interlayer insulating layer 41 and the second interlayer insulating layer 42 are sequentially deposited across the entire surface similarly to [Step-310] of the third embodiment. Specifically, the first interlayer insulating layer 41 and the second interlayer insulating layer 42 are sequentially deposited over the gate electrode 23, the side wall film 17, and the upper insulating layer 21B (see FIG. 4A).

[Step-420]

Figure 4B:
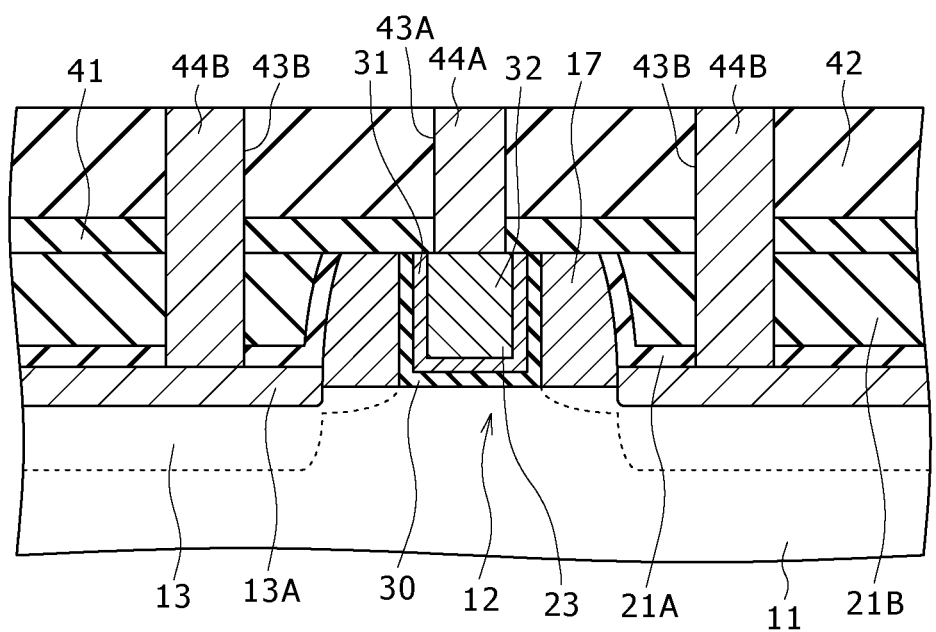
Figure 5A:
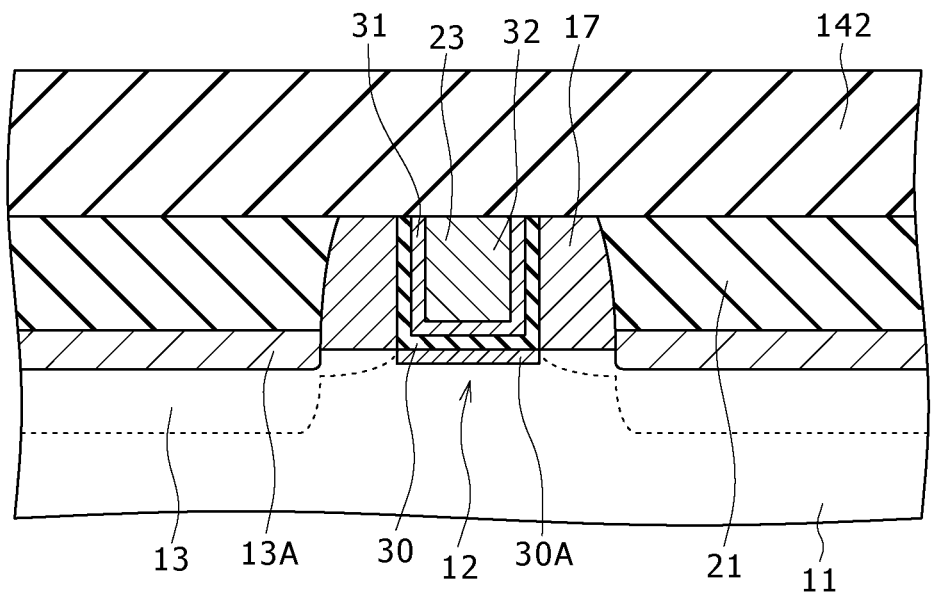
FIGS. 5A and 5B are schematic partial end views of a semiconductor substrate and so on, for explaining a related-art method for manufacturing an insulated gate field effect transistor and a problem of the method.
Figure 5B:
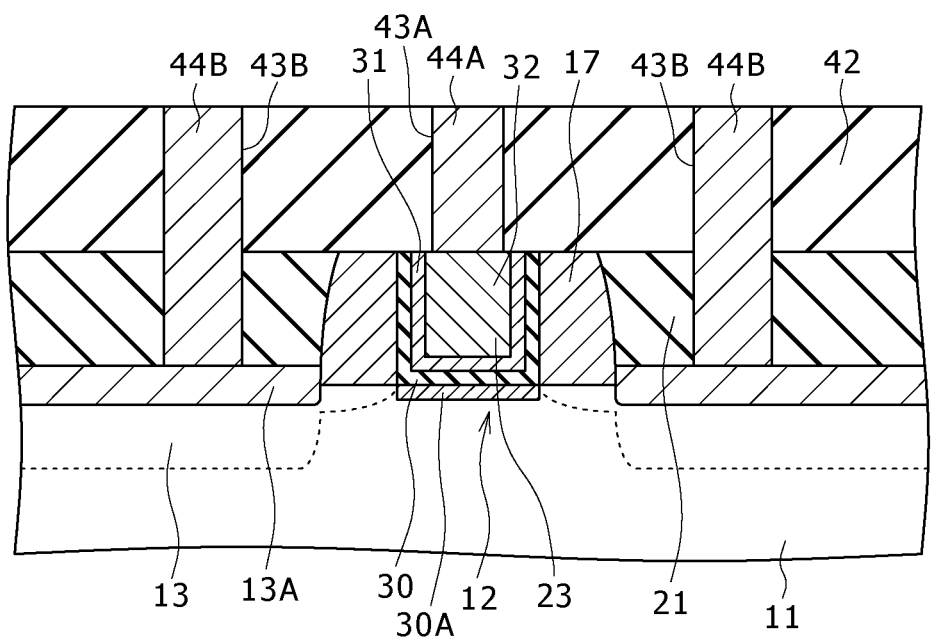

Thereafter, the contact plugs 44A and 44B are formed similarly to [Step-140] of the first embodiment (see FIG. 4B). Subsequently, interconnects and so on (not shown) are formed on the second interlayer insulating layer 42 according to need, so that the insulated gate field effect transistor of the fourth embodiment can be completed.

Also in the fourth embodiment, the first interlayer insulating layer 41 is deposited in a deposition atmosphere containing no oxygen atom in [Step-410]. This feature can surely prevent the occurrence of a phenomenon of oxidation of a partial portion of the base (silicon semiconductor substrate 11) facing the gate electrode, and thus can surely avoid the occurrence of a problem of the deterioration of characteristics of the insulated gate field effect transistor, such as the lowering of the gate capacitance.

This is the end of the description of preferred embodiments of the present invention. The invention however is not limited to these embodiments. The structures and configurations of the insulated gate field effect transistors described in the embodiments are merely examples and can be arbitrarily changed. In addition, the manufacturing conditions and so on for the insulated gate field effect transistors described in the embodiments are also merely examples and can be arbitrarily changed.

Although the first to fourth embodiments are applied to an n-channel insulated gate field effect transistor, the embodiments can be applied also to a p-channel insulated gate field effect transistor. In this case, e.g. ruthenium (Ru) or TiN can be used as the material of the work function control layer 31. In addition, there has also been proposed a method in which the work function value is adjusted by varying the material of the gate insulating film instead of varying the material of the gate electrode for allowing the gate electrode to have a favorable work function value (refer to e.g. Japanese Patent Laid-Open No. 2006-24594). This method can also be applied to embodiments of the present invention.

The first interlayer insulating layer is composed of SiN in the embodiments. Alternatively, it can be formed by using SiC. In the case of depositing the first interlayer insulating layer composed of SiC based on CVD in which a source gas with a composition containing neither oxygen atoms nor oxygen molecules is used, e.g. the following deposition condition is available: the total flow rate of a $(SH_3)_3SiH$ gas, He gas, and $NH_3$ gas is 700 sccm; the temperature is 400° C. or lower; and the pressure is $1.3\times10^2$ Pa to $1.3\times10^3$ Pa.

It should be understood by those skilled in the art that various modifications, combinations, sub-combinations and alterations may occur depending on design requirements and other factor in so far as they are within the scope of the appended claims or the equivalents thereof.

What is claimed is:

1. A method for manufacturing an insulated gate field effect transistor, the method comprising the steps of:
    (a) preparing a base that includes source/drain regions, a channel forming region, a gate insulating film formed on the channel forming region, an insulating layer covering the source/drain regions, and a gate electrode formation opening provided in a partial portion of the insulating layer above the channel forming region;
    (b) forming a gate electrode by burying (i) a work function control layer and (ii) a conductive material layer in the gate electrode formation opening;
    (c) removing the insulating layer to expose the source/drain regions; and
    (d) depositing a first interlayer insulating layer and a second interlayer insulating layer sequentially across an entire surface of the exposed source/drain regions by vapor deposition;
    (e) forming sidewalls that define the gate electrode formation opening; and
    (f) removing an insulating film abutting at least one of the sidewalls so that the sidewalls remain intact,
    wherein,
        the first interlayer insulating layer is deposited in a deposition atmosphere containing no oxygen atom and is effective to prevent (i) oxidation of a partial portion of the base facing the gate electrode, and (ii) lowering of a gate capacitance,
        the second interlayer insulating layer is formed in an atmosphere containing oxygen, and
        the first interlayer insulating layer is deposited in the deposition atmosphere at lower than 400° C.

2. The method for manufacturing the insulated gate field effect transistor according to claim 1, wherein the first interlayer insulating layer is composed of a silicon nitride or a silicon carbide, and the second interlayer insulating layer is composed of a silicon oxide.

3. The method for manufacturing the insulated gate field effect transistor according to claim 1, wherein in the step (d), the first interlayer insulating layer is deposited based on chemical vapor deposition in which a source gas with a composition containing neither an oxygen atom nor an oxygen molecule is used.

4. The method for manufacturing the insulated gate field effect transistor according to claim 1, wherein in the step (d), the second interlayer insulating layer is deposited based on chemical vapor deposition in which a source gas with a composition containing an oxygen atom or an oxygen molecule is used.

5. The method for manufacturing the insulated gate field effect transistor according to claim 1, wherein the conductive material layer is composed of tungsten.

6. The method for manufacturing the insulated gate field effect transistor according to claim 1, further comprising the step of:
    forming a plurality of openings through the first interlayer insulating layer and the second interlayer insulating layer above the gate electrode and the source/drain regions.

7. A method for manufacturing an insulated gate field effect transistor, the method comprising the steps of:
    (a) providing a base that includes source/drain regions, a channel forming region, a gate insulating film formed on the channel forming region, an insulating layer covering the source/drain regions, and a gate electrode formation opening provided in a partial portion of the insulating layer above the channel forming region;
    (b) depositing a conductive material layer on the base and burying part of the conductive layer in the gate electrode formation opening;
    (c) forming a gate electrode in the gate electrode formation opening by polishing the conductive material layer over the insulating layer;
    (d) depositing a first interlayer insulating layer and a second interlayer insulating layer sequentially across an entire surface over the source/drain regions;
    (e) forming sidewalls that define the gate electrode formation opening; and
    (f) removing an insulating film abutting at least one of the sidewalls so that the sidewalls remain intact,
    wherein
        the first interlayer insulating layer is deposited in a deposition atmosphere containing no oxygen atom and is effective to prevent (i) oxidation of a partial portion of the base facing the gate electrode, and (ii) lowering of gate capacitance,
        the second interlayer insulating layer is formed in a deposition atmosphere containing oxygen,
        the insulating layer has a planarized surface, and
        the first interlayer insulating layer is deposited in the deposition atmosphere at lower than 400° C.

8. The method for manufacturing the insulated gate field effect transistor according to claim 7, wherein in the step (d), the first interlayer insulating layer is deposited based on chemical vapor deposition in which a source gas with a composition containing neither an oxygen atom nor an oxygen molecule is used.

9. The method for manufacturing the insulated gate field effect transistor according to claim 7, wherein in the step (d), the second interlayer insulating layer is deposited based on chemical vapor deposition in which a source gas with a composition containing an oxygen atom or an oxygen molecule is used.

10. The method for manufacturing the insulated gate field effect transistor according to claim 7, wherein the conductive material layer is composed of tungsten.

11. The method for manufacturing the insulated gate field effect transistor according to claim 7, wherein in the step (c), planarization treatment is carried out after the conductive material layer is so formed across an entire surface as to be buried in the gate electrode formation opening, to thereby form the gate electrode in the gate electrode formation opening.

12. The method for manufacturing the insulated gate field effect transistor according to claim 7, further comprising the step of:
    forming a plurality of openings through the first interlayer insulating layer and the second interlayer insulating layer above the gate electrode and the source/drain regions.

* * * * *